(12) United States Patent
Zang (10) Patent No.: US 9,252,273 B2
(45) Date of Patent: Feb. 2, 2016

(54) GATE STACK AND CONTACT STRUCTURE (71) Applicant: GLOBALFOUNDRIES Inc., Grand Cayman (KY)

(72) Inventor: Hui Zang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 78 days.

(21) Appl. No.: 14/147,181

(22) Filed: Jan. 3, 2014

(65) Prior Publication Data
US 2015/0194517 A1   Jul. 9, 2015

(51) Int. Cl.
| H01L 21/336 | (2006.01) |
| H01L 29/78 | (2006.01) |
| H01L 29/66 | (2006.01) |
| H01L 21/283 | (2006.01) |
| H01L 21/02 | (2006.01) |
| H01L 29/417 | (2006.01) |
| H01L 29/423 | (2006.01) |
| H01L 21/8234 | (2006.01) |

(52) U.S. Cl.
CPC ........ *H01L 29/785* (2013.01); *H01L 21/02057* (2013.01); *H01L 21/02112* (2013.01); *H01L 21/283* (2013.01); *H01L 21/823418* (2013.01); *H01L 29/41775* (2013.01); *H01L 29/41791* (2013.01); *H01L 29/4238* (2013.01); *H01L 29/66545* (2013.01)

(58) Field of Classification Search
CPC .................. H01L 29/41791; H01L 29/41775; H01L 21/823418; H01L 29/4238
See application file for complete search history.

(56) References Cited

U.S. PATENT DOCUMENTS

| 6,440,830 B1 * | 8/2002 | Lopatin ......................... 438/592 |
| 2007/0126067 A1 * | 6/2007 | Hattendorf et al. ........... 257/412 |
| 2007/0194387 A1 * | 8/2007 | Dyer et al. ..................... 257/369 |
| 2010/0258869 A1 * | 10/2010 | Morita et al. ................. 257/347 |
| 2013/0161763 A1 * | 6/2013 | Ando et al. .................... 257/408 |

FOREIGN PATENT DOCUMENTS

JP    WO 2012147287 A1 *   11/2012   .......... H01L 29/2003

* cited by examiner

*Primary Examiner* — Meiya Li
*Assistant Examiner* — Peter M Albrecht
(74) *Attorney, Agent, or Firm* — Ditthavong & Steiner, P.C.

(57) ABSTRACT

A process for fabrication of semiconductor devices, particularly fin-shaped Field Effect Transistors (FinFETs), having a low contact horizontal resistance and a resulting device are provided. Embodiments include: providing a substrate having source and drain regions separated by a gate region; forming a gate electrode having a first length on the gate region; forming an epitaxy layer on the source and drain regions; forming a contact layer having a second length, longer than the first length, at least partially on the epitaxy layer; and forming an oxide layer on top and side surfaces of the contact layer for at least the first length.

12 Claims, 13 Drawing Sheets

GATE STACK AND CONTACT STRUCTURE

TECHNICAL FIELD

The present disclosure relates to a manufacture of semiconductor devices, such as fin-shaped Field Effect Transistors (FinFETs). The present disclosure is particularly applicable to 10 nanometer (nm) technology nodes and beyond.

BACKGROUND

In a fabrication of semiconductor devices, many FinFETs rely on a tall gate structure. Such a structure may allow for a reduction in horizontal resistance. However, a tall gate structure typically results in high parasitic capacitance, and may require complex or costly metal chamfering and self-aligned contact (SAC) processes.

A need therefore exists for methodologies for fabrication of semiconductor devices, particularly FinFETs, having a low gate horizontal resistance without use of a tall gate structure, and a resulting device.

SUMMARY

An aspect of the present disclosure is a method of providing a contact layer having a length longer than a length of a gate electrode, at least partially on an epitaxy layer.

Another aspect of the present disclosure is a device including a contact layer having a length longer than a length of a gate electrode, at least partially on an epitaxy layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a substrate having source and drain regions separated by a gate region; forming a gate electrode having a first length on the gate region; forming an epitaxy layer on the source and drain regions; forming a contact layer having a second length, longer than the first length, at least partially on the epitaxy layer; and forming an oxide layer on top and side surfaces of the contact layer for at least the first length.

Aspects include forming the gate electrode by: forming a polycrystalline silicon gate on the gate region; forming a nitride layer on at least side surfaces of the polycrystalline silicon gate; removing the polycrystalline silicon gate to form a recess; forming a high-k dielectric in the recess; forming a metal gate on the high-k dielectric in the recess; and reducing a height of the metal gate; and forming a second contact layer on the metal gate for the first length. Additional aspects include: forming the nitride layer on side and top surfaces of the polycrystalline silicon gate; and removing the nitride from the top surface prior to removing the polycrystalline silicon gate electrode. Further aspects include: forming the gate electrode by: forming a high-k dielectric layer in the gate region; forming a dummy gate on the high-k dielectric layer; annealing, prior to providing the oxide layer on the top surface of the contact layer; removing the dummy gate to form a recess; forming a replacement metal gate on the high-k dielectric layer in the recess; and reducing a height of the metal gate; and providing a second contact layer on the replacement metal gate for the first length. Additional aspects include a method, wherein the high-k dielectric is at side and bottom surfaces of the dummy gate, the method further including forming a nitride layer on side surfaces of the high-k dielectric layer. Further aspects include: forming the first and second contact layers of tungsten (W); and forming the dummy gate of titanium nitride (TiN) and polycrystalline silicon. Some aspects include: forming a low-k dielectric layer having first and second portions on the oxide layer in the drain and source regions, respectively; and reducing a height of the gate electrode; and forming a second contact layer between the first and second portions of the low-k dielectric layer and on the gate electrode, extending over the drain and source regions over the first length, and being separated from the first contact layer by the oxide layer. Additional aspects include: forming a shallow trench isolation (STI) region in the substrate horizontally beyond the epitaxy layer, the first contact extending over the STI region; forming a vertical portion of the first contact layer over the STI region; and forming a second contact layer on the gate electrode.

Another aspect of the present disclosure is a device including: a substrate having source and drain regions separated by a gate region; a gate electrode having a first length on the gate region; an epitaxy layer on the source and drain regions; a contact layer having a second length, longer than the first length, at least partially on the epitaxy layer; and an oxide layer on top and side surfaces of the contact layer for at least the first length.

Some aspects include the gate electrode including: a metal gate; a high-k dielectric on side and bottom surfaces of the metal gate; a nitride layer on side surfaces of the high-k dielectric; and a second contact layer on the metal gate for the first length. Additional aspects include: the oxide layer separating the first and second contact layers; and the oxide and nitride layers separating the first contact layer and the metal gate. Further aspects include: the metal gate and first and second contact layers including W; and the metal gate including a TiC work function metal. Some aspects include: a low-k dielectric layer having first and second portions on the oxide layer in the drain and source regions, respectively; and a second contact layer on the gate electrode between the first and second portions of the low-k dielectric layer, the second contact layer extending over the drain and source regions over the first length and being separated from the first contact layer by the oxide layer. Further aspects include: a STI region in the substrate horizontally beyond the epitaxy layer, the first contact extending over the STI region; a vertical portion of the first contact layer over the STI region; and a second contact layer on the gate region. Some aspects include: a horizontal portion of the first contact layer on the epitaxy layer having a thickness of 20 nm to 100 nm; and a portion of the second contact layer extending horizontally over the source and drain regions having a thickness of 20 nm to 400 nm. Further aspects include a low-k dielectric layer separating the vertical portion of the first contact layer from the second contact layer.

Another aspect of the present disclosure is a method including: providing a substrate having source and drain regions separated by a gate region; forming a gate electrode having a first horizontal length on the gate region and a first height; forming an epitaxy layer on the source and drain regions; forming an STI region in the substrate horizontally beyond the epitaxy layer; forming a W contact layer having a second horizontal length, longer than the first horizontal length, and a second height, less than the first height, at least partially on the epitaxy layer, the contact layer extending horizontally over the STI region and including a vertical portion over the STI region; and forming an oxide layer on top and side surfaces of the contact layer for at least the first length.

Some aspects include forming the gate electrode by: forming a polycrystalline silicon gate on the gate region; forming a nitride layer on side and top surfaces of the polycrystalline silicon gate; removing the nitride from the top surface of the polycrystalline silicon gate; removing, after removal of the nitride from the top surface of the polycrystalline silicon gate, the polycrystalline silicon gate to form a recess; forming a high-k dielectric in the recess; forming a TiC work function metal on the high-k dielectric in the recess; forming a metal gate on the work function metal in the recess; and reducing the height of the metal gate to the first height; and forming a second contact layer on the metal gate for the first horizontal length. Additional aspects include forming the gate electrode by: forming a high-k dielectric layer in the gate region; forming a dummy gate on the high-k dielectric layer, the dummy gate including TiN and polycrystalline silicon; annealing, prior to providing the oxide layer on the top and side surfaces of the first contact layer; removing the dummy gate to form a recess; forming a TiC work function metal layer in the recess; forming a replacement metal gate on the work function metal in the recess; reducing a height of the metal gate to the first height; and forming a W second contact layer on the metal gate for the first length; and forming a nitride layer on side surfaces of the high-k dielectric layer. Further aspects include: forming a low-k dielectric layer having first and second portions on the oxide layer in the drain and source regions, respectively; and forming a second contact layer on the gate electrode and between the first and second portions of the low-k dielectric layer, extending over the drain and source regions over the first horizontal length, and being separated from the first contact layer by the oxide layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of high gate horizontal resistance or complex metal chamfering and SAC processes attendant upon fabricating FinFET gate and source/drain contact structures at 10 nm technology nodes and beyond. The problems are solved, for instance, by providing a source/drain contact layer having a length longer than a length of a gate electrode, and a vertical portion beyond the gate electrode.

Methodology in accordance with embodiments of the present disclosure includes: providing a substrate having source and drain regions separated by a gate region; forming a gate electrode having a first length on the gate region; forming an epitaxy layer on the source and drain regions; forming a contact layer having a second length, longer than the first length, at least partially on the epitaxy layer; and forming an oxide layer on top and side surfaces of the contact layer for at least the first length.

Figure 1:
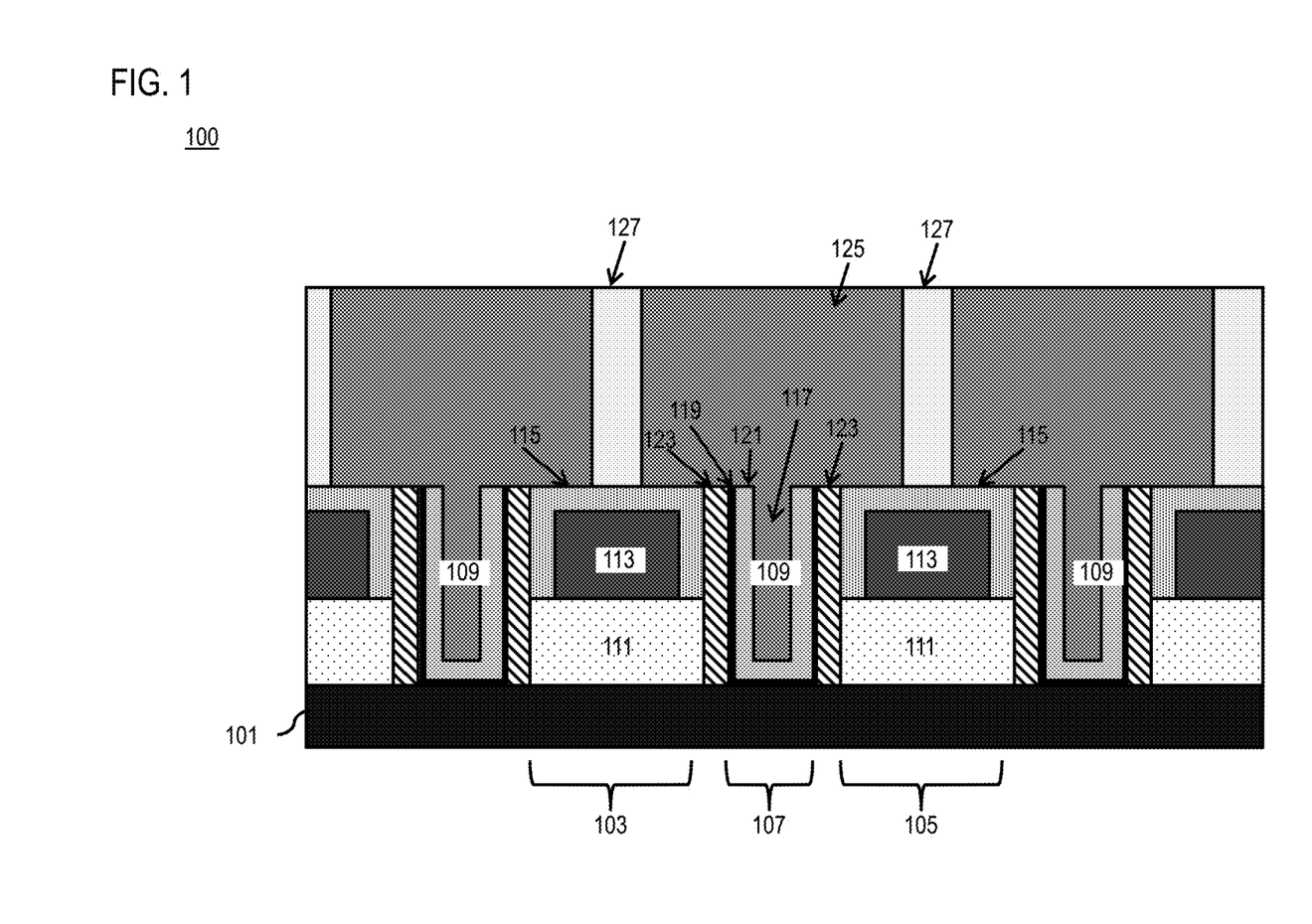
FIG. 1 illustrates a cross sectional view of a gate stack and contact structure, in accordance with an exemplary embodiment.

FIG. 1 includes a device 100 having a (bulk silicon) substrate 101 with source and drain regions 103 and 105, respectively separated by gate region 107. The gate region 107 includes a gate stack 109 and the source and drain regions 103 and 105 include an epitaxy layer 111, contact layer 113 (e.g., W), and oxide layer 115. As shown, a horizontal portion of the contact layer 113 has a thickness of 20 nm to 100 nm.

The gate stack 109 may include metal gate 117, high-k dielectric 119 (e.g., a material having a relative dielectric constant value greater than 3.9), and work function metal 121 (e.g., TiC). A gate contact layer 125 (e.g., W) is formed over the gate stack 109. As shown, the gate contact layer 125 extends over source and drain regions 103 and 105, resulting in a wide horizontal region that reduces a gate resistance and allows for manufacturing variances in landing the gate contact layer 125 onto the gate stack 109. Moreover, the device 100 separates the gate contact layer 125 and the contact layer 113, resulting in a low parasitic capacitance compared to traditional methods. A nitride layer 123 is formed around high-k dielectric 119. As shown, the oxide layer 115 separates the contact layers 113 and 125 and the oxide and nitride layers 115 and 123, respectively, separate the contact layer 113 and the metal gate 117. Additionally, the gate contact layer 125 has a portion extending horizontally over the source and drain regions 103 and 105, respectively, having a thickness of 20 nm to 400 nm.

Additionally, the device 100 further includes a low-k dielectric layer 127 (e.g., a material having a relative dielectric constant value less than 3.9) having first and second portions on the oxide layer 115 in the source and drain regions 103 and 105, respectively, and the gate contact layer 125 is between the first and second portions of the low-k dielectric layer 127. As shown, the gate contact layer 125 extends over edges of the source and drain regions 103 and 105, respectively.

Figure 2:
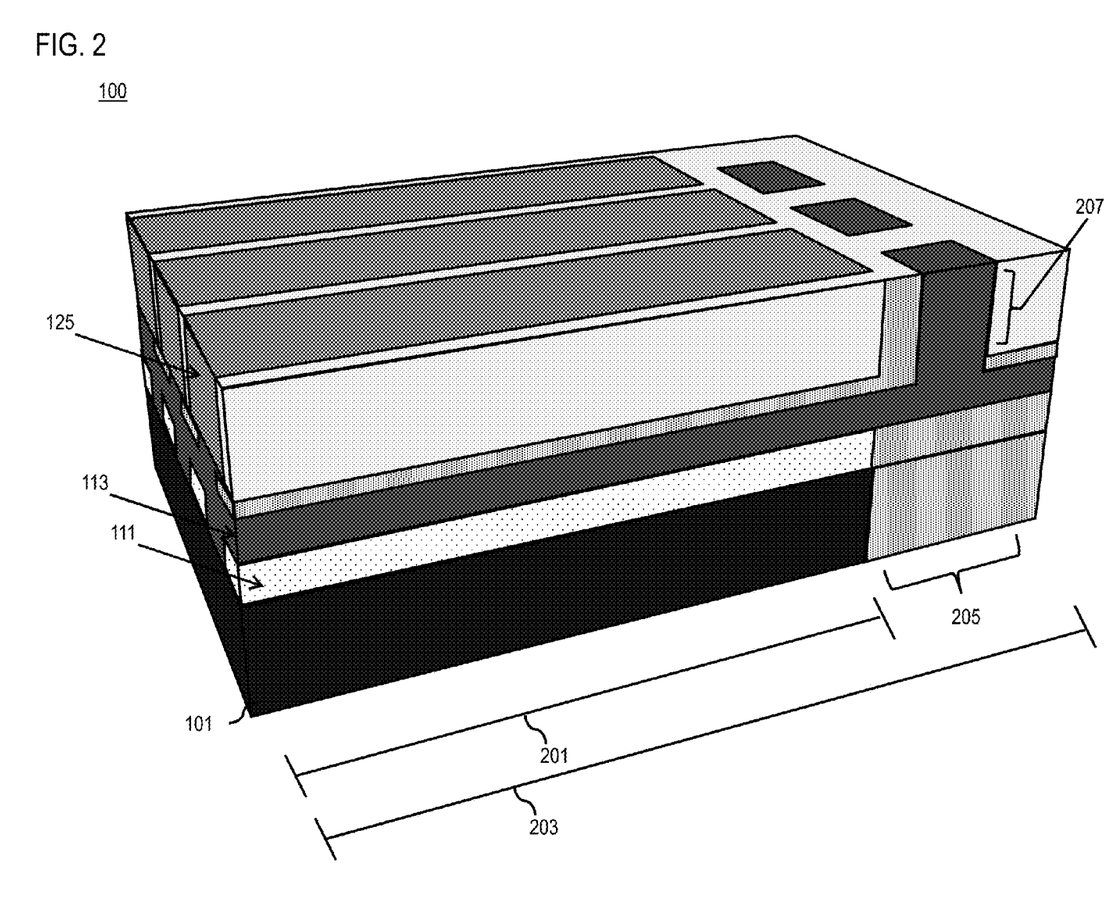
FIG. 2 illustrates a first three-dimensional view of a gate stack and contact structure, in accordance with an exemplary embodiment.
Figure 3:
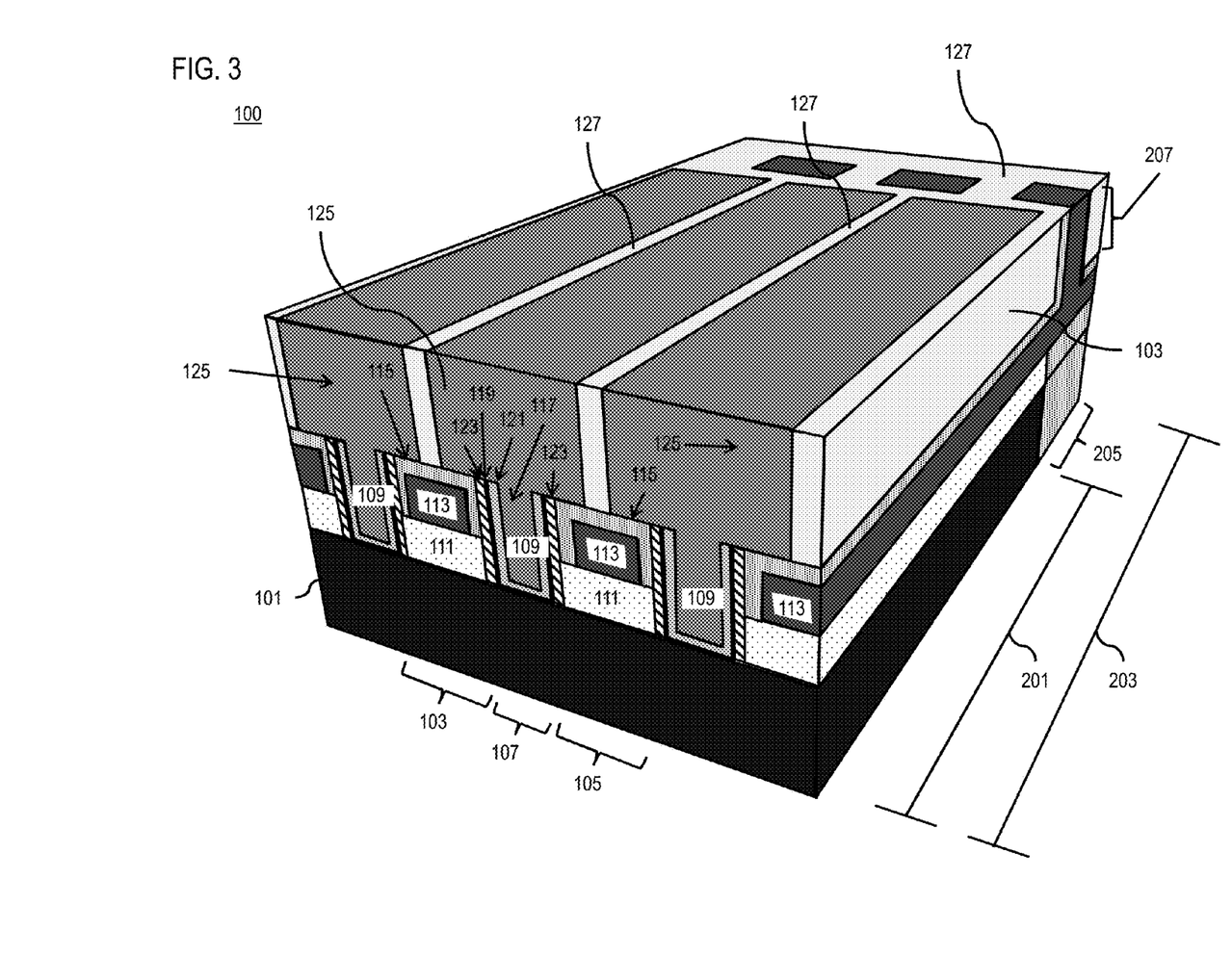
FIG. 3 illustrates a second three-dimensional view of a gate stack and contact structure, in accordance with an exemplary embodiment.

FIG. 2 illustrates the epitaxy layer 111 and gate contact layer 125 extending a first horizontal distance 201 and the contact layer 113 extending a second horizontal distance 203, longer than the first horizontal distance, into a STI region 205 of substrate 101. As shown, the contact layer 113 includes a vertical portion 207 (e.g., contact landing portion) over the STI region 205 that is landed onto the contact layer 113 (e.g., buried contact). FIG. 3 illustrates the low-k dielectric layer 127 separating the vertical portion 207 of the contact layer 113 from the gate contact layer 125.

Figure 4:
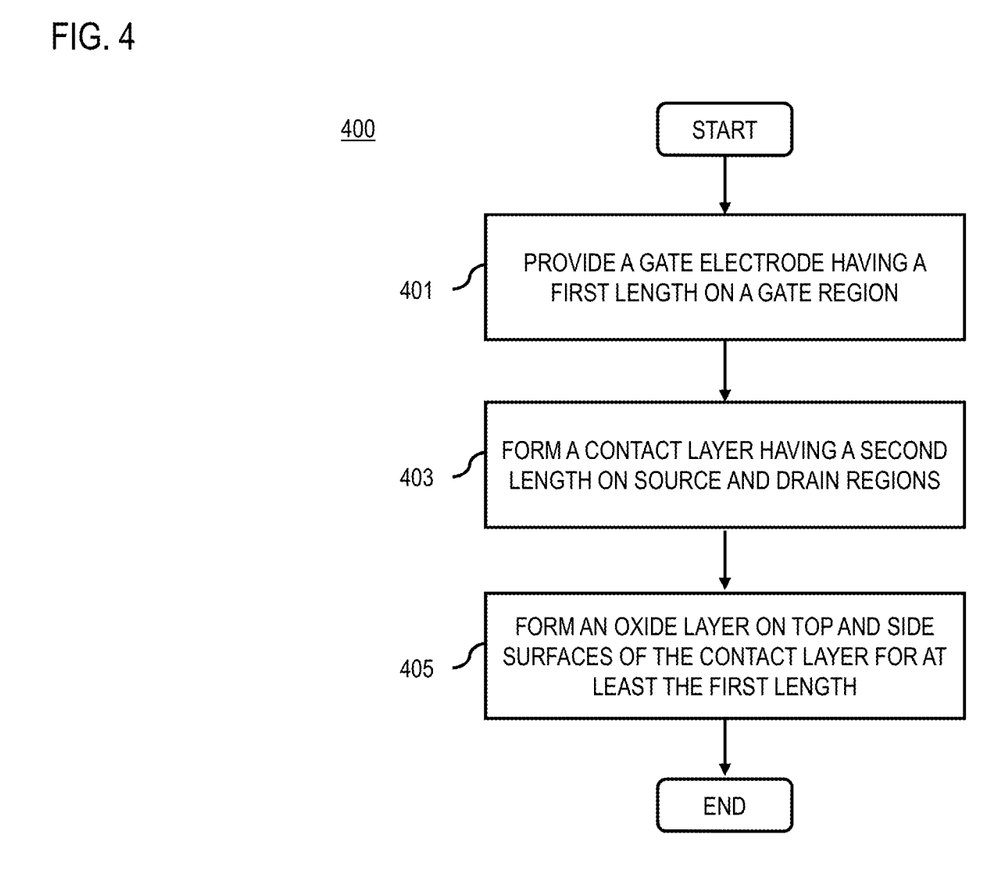
FIG. 4 is a flowchart of a partial fabrication of semiconductor devices having a low gate horizontal resistance, in accordance with an exemplary embodiment.

FIG. 4 is a flowchart of a process 400 for partial fabrication of semiconductor devices having a low gate horizontal resistance, according to an exemplary embodiment. The process of FIG. 4 is discussed with respect to a first method illustrated in FIGS. 5 through 10 and a second method illustrated in FIGS. 11 through 15.

Figure 5:
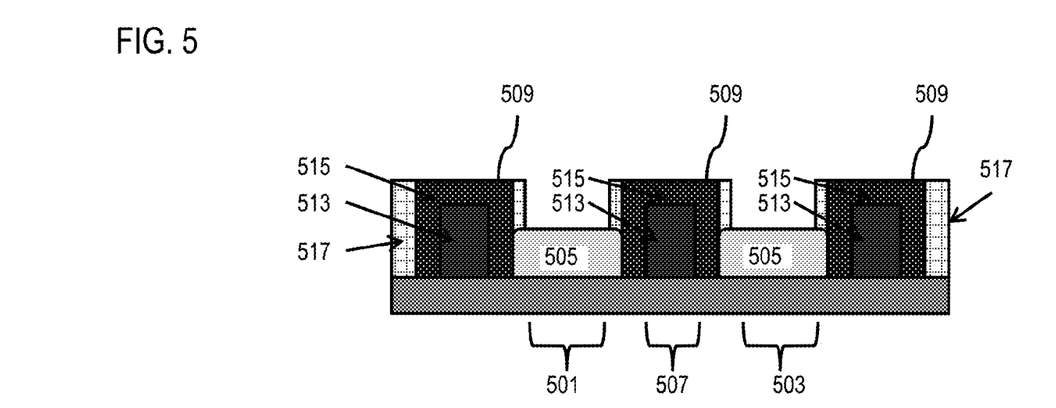
FIGS. 5 through 10 illustrate a first method for partial fabrication of semiconductor devices having a low gate horizontal resistance, in accordance with an exemplary embodiment.

In step 401, the process 400 provides a gate electrode having a first length on a gate region between source and drain regions. As illustrated in FIG. 5, source and drain regions 501 and 503, respectively, having an epitaxy layer 505 are separated by a gate region 507 having a gate stack 509. The gate stack 509 extends for a first horizontal distance 201 (as illustrated in FIG. 2). The gate stack 509 may, for instance, be formed as a dummy gate 513 of polycrystalline silicon. A nitride layer 515 surrounds gate stack 509 on side and top surfaces. An oxide layer 517 may be formed on epitaxy layer 505 adjacent side surfaces of the nitride layer 515.

Figure 6:
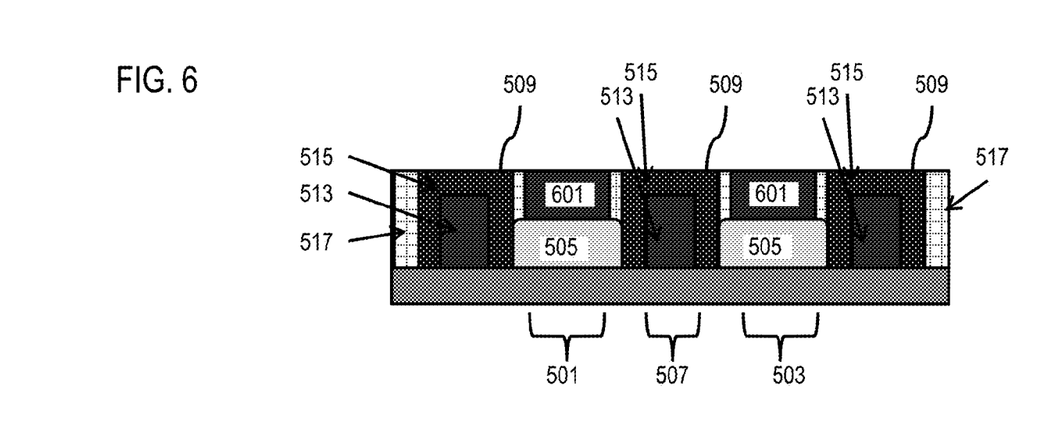

Adverting to FIG. 6, a contact layer 601 (e.g., W) is formed, as in step 403, having a length 203 (as shown if FIG. 2) on source and drain regions 501 and 503, respectively. The nitride layer 515 may act as a SAC layer during an etching process for the contact layer 601. The length of contact layer 601 is longer than the length of gate stack 509, but contact layer 601 is formed on the epitaxy layer 505 for the length of the gate electrode. The process 400 may optionally include a polish on chip, and chemical-mechanical planarization (CMP) after forming the contact layer 601.

Figure 7:
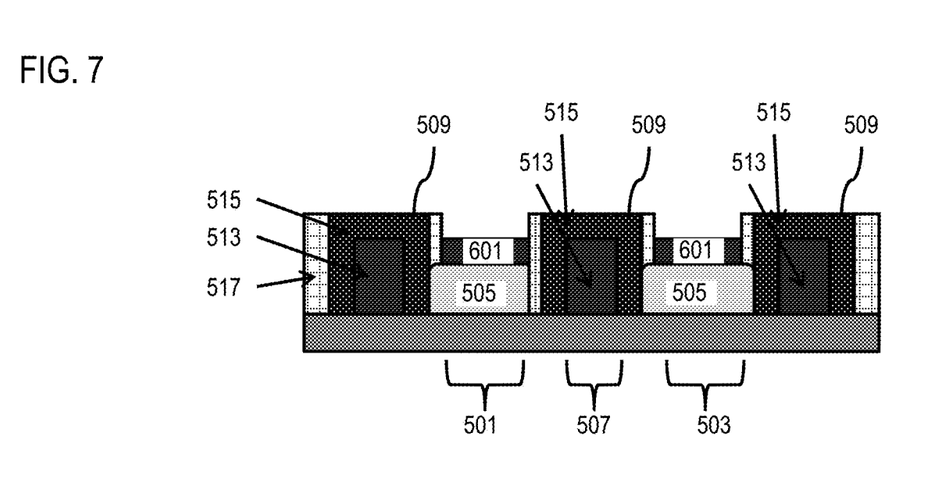
Figure 8:
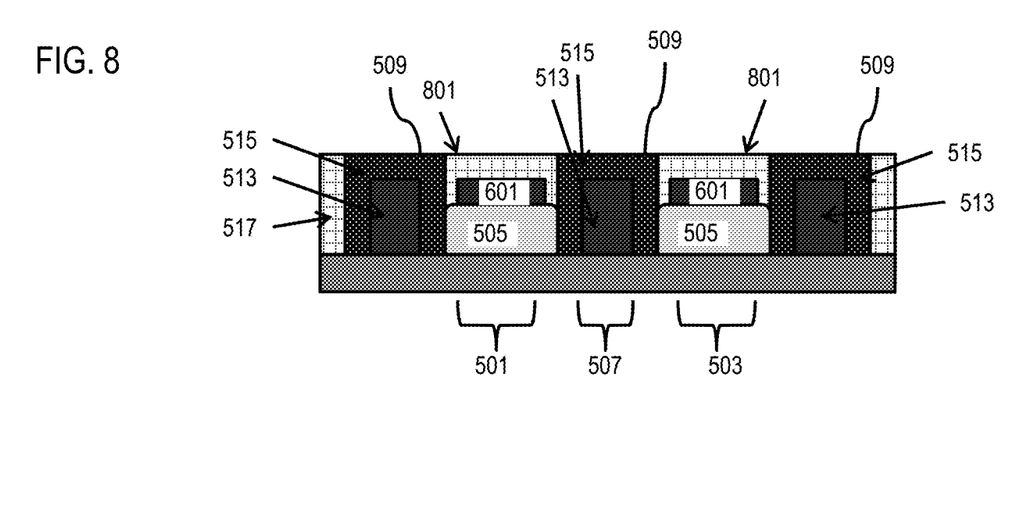

Adverting to FIG. 7, a reactive-ion etching (RIE) is performed to reduce the contact layer 601 to, for instance, a thickness of 20 nm to 100 nm. As illustrated in FIG. 8, an oxide layer 801 is then formed, as in step 405, over the contact layer 601. The oxide layer 801 is on top and side surfaces of the contact layer 601 for the length of the gate stack 109.

Figure 9:
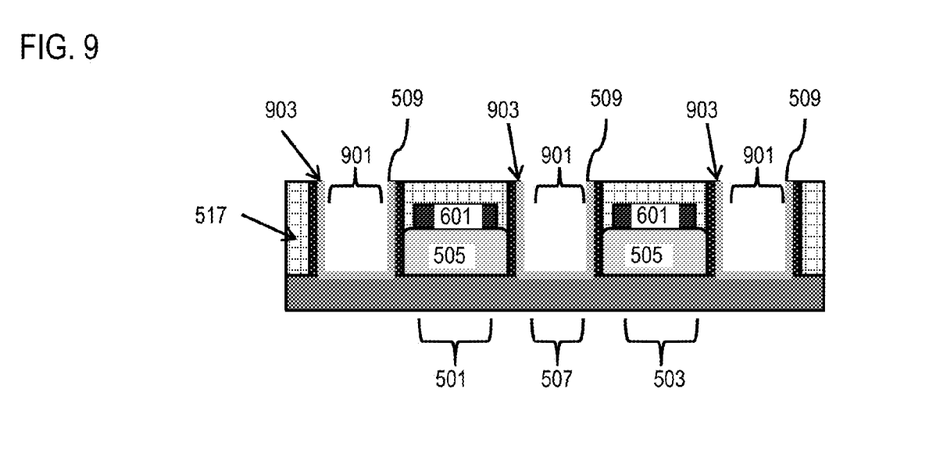
Figure 10:
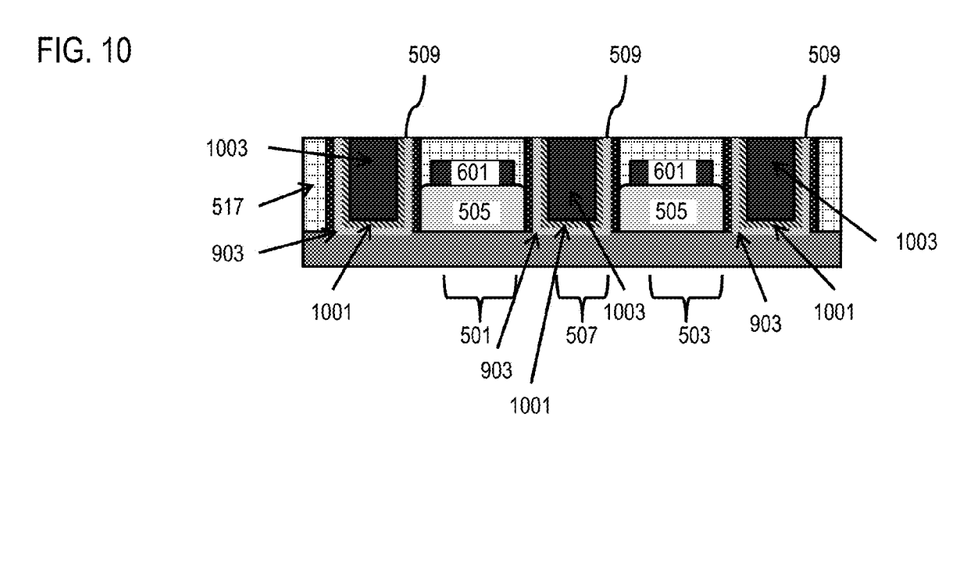

Adverting to FIG. 9, the polycrystalline silicon dummy gate 513 is removed to form a recess 901. The process may include, for instance, a RIE and a chemical washing. As shown, a high-k dielectric 903 is deposited in the recess. As shown in FIG. 10, a work function metal 1001 (e.g., TiC)) is formed on the high-k dielectric 903 and a metal gate 1003 (e.g., W) is formed on the work function metal 1001.

As noted above, a second method illustrating the process of FIG. 4 is illustrated in FIGS. 11 through 15.

Figure 11:
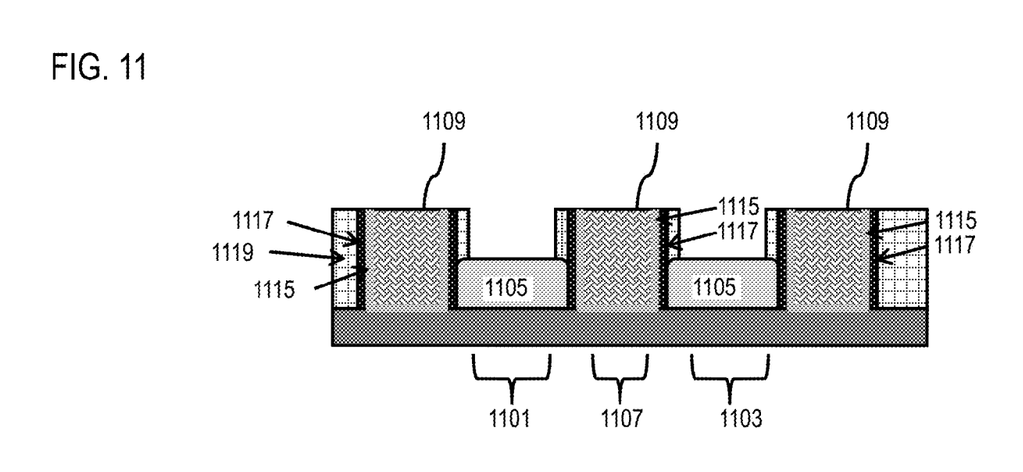
FIGS. 11 through 15 illustrate a second method for partial fabrication of semiconductor devices having a low gate horizontal resistance, in accordance with an exemplary embodiment.

In step 401, the process 400 provides a gate electrode having a first length on a gate region. As illustrated in FIG. 11, source and drain regions 1101 and 1103, respectively, having an epitaxy layer 1105 are separated by a gate region 1107 having a gate electrode 1109. The gate electrode 1109 may, for instance, be a dummy gate (e.g., TiN and polycrystalline silicon) with a high-k dielectric layer 1115 on side and bottom surfaces thereof. A nitride layer 1117 may be formed at side surfaces of high-k dielectric layer 1115. An oxide layer 1119 may be formed on epitaxy layer 1105 adjacent side surfaces of the nitride layer 1117. An annealing process is then performed.

Figure 12:
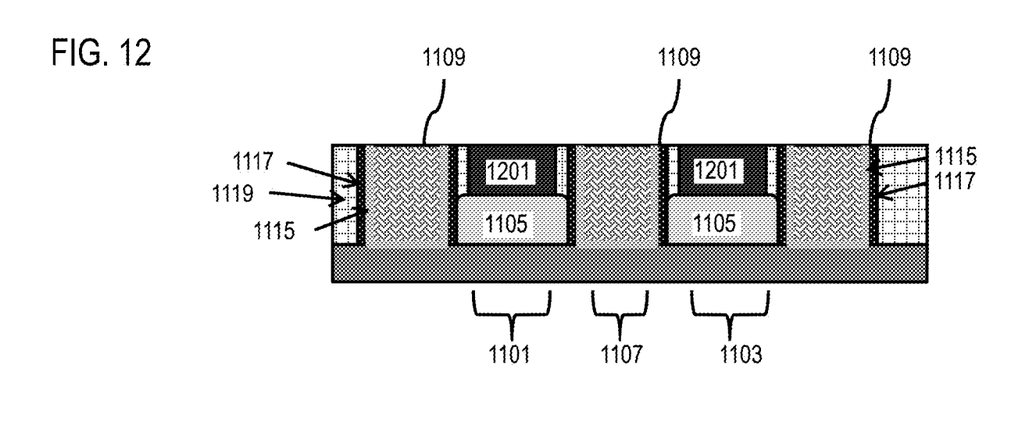

Adverting to FIG. 12, a contact layer 1201 (e.g., W) is formed, as in step 403, on epitaxy layer 1105 over source and drain regions 1101 and 1103. The length of contact layer 1201 is longer than a length of the gate electrode 1109. The process 400 may optionally include a polish on chip and CMP after formation of the contact layer 1201. Similarly to FIG. 7, a RIE may be performed to reduce the contact layer 1201 to, for instance, a thickness of 20 nm to 100 nm.

Figure 13:
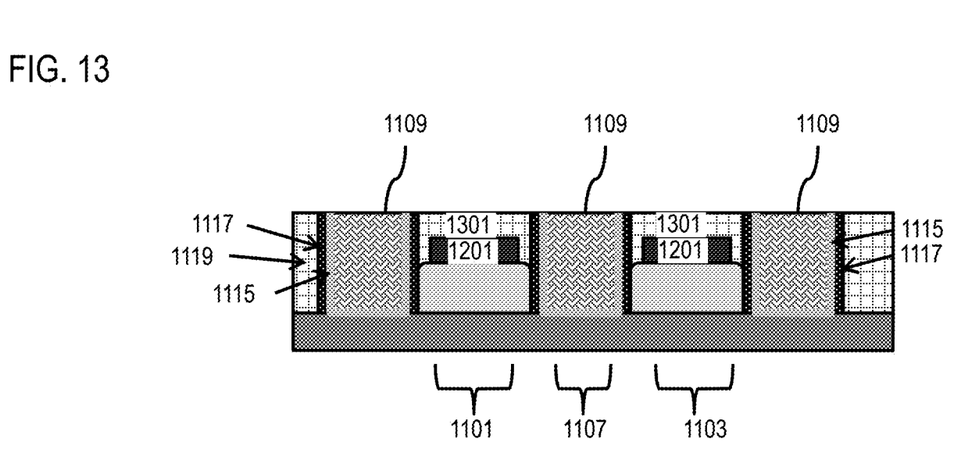

Adverting to FIG. 13, an oxide layer 1301 is formed, as in step 405, on top and side surfaces of the contact layer 1201 for the length of the gate electrode.

Figure 14:
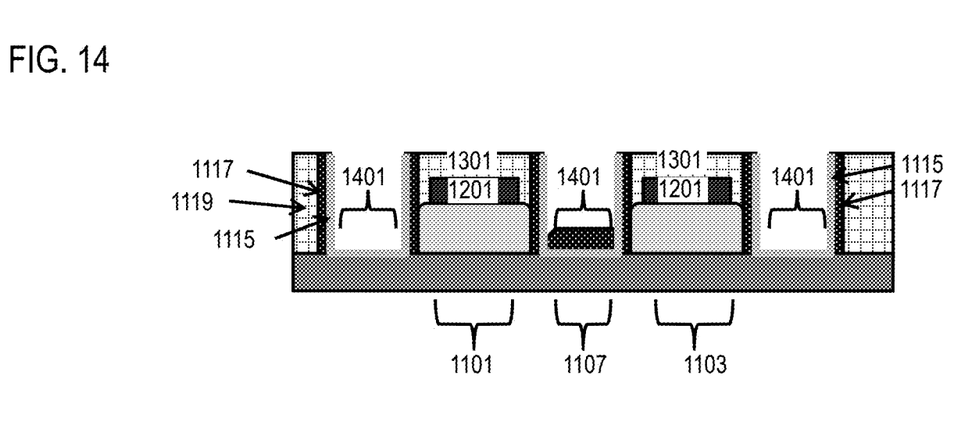
Figure 15:
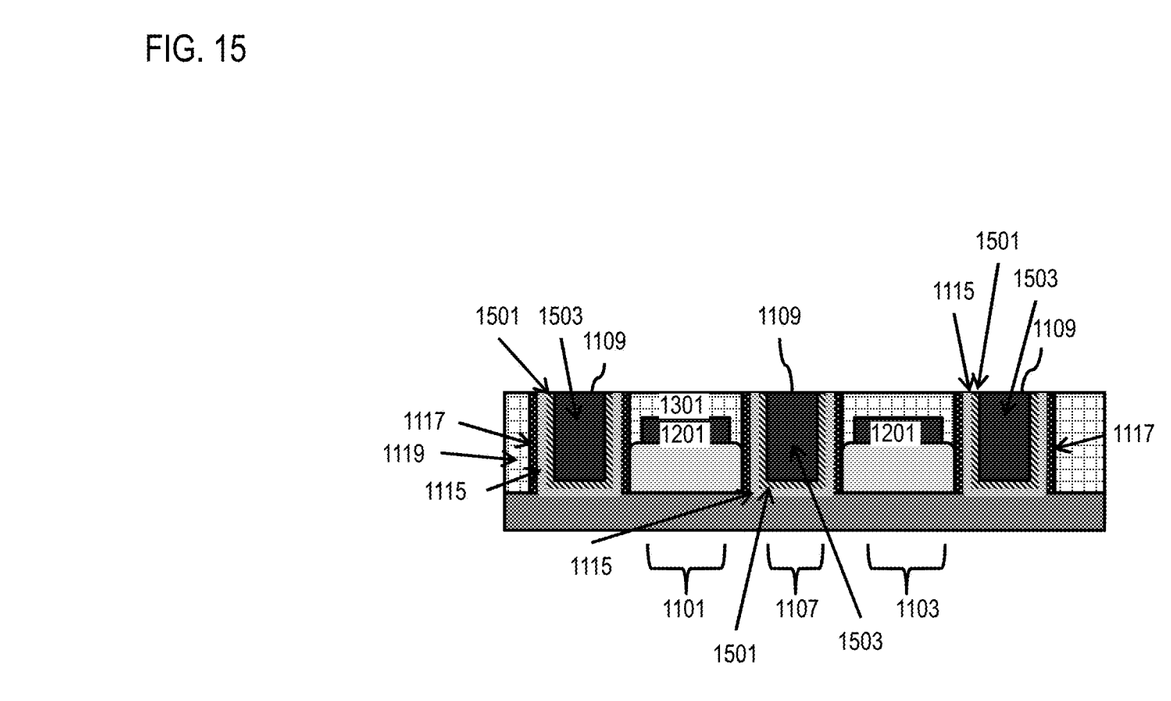

Adverting to FIG. 14, the dummy gate of the gate electrode 1109 is removed to form a recess 1401. As shown in FIG. 15, a work function metal layer 1501 (e.g., TiC) is provided on the high-k dielectric layer 1115 and a replacement metal gate 1503 (e.g., W) is provided on the work function metal layer 1501.

Figure 16:
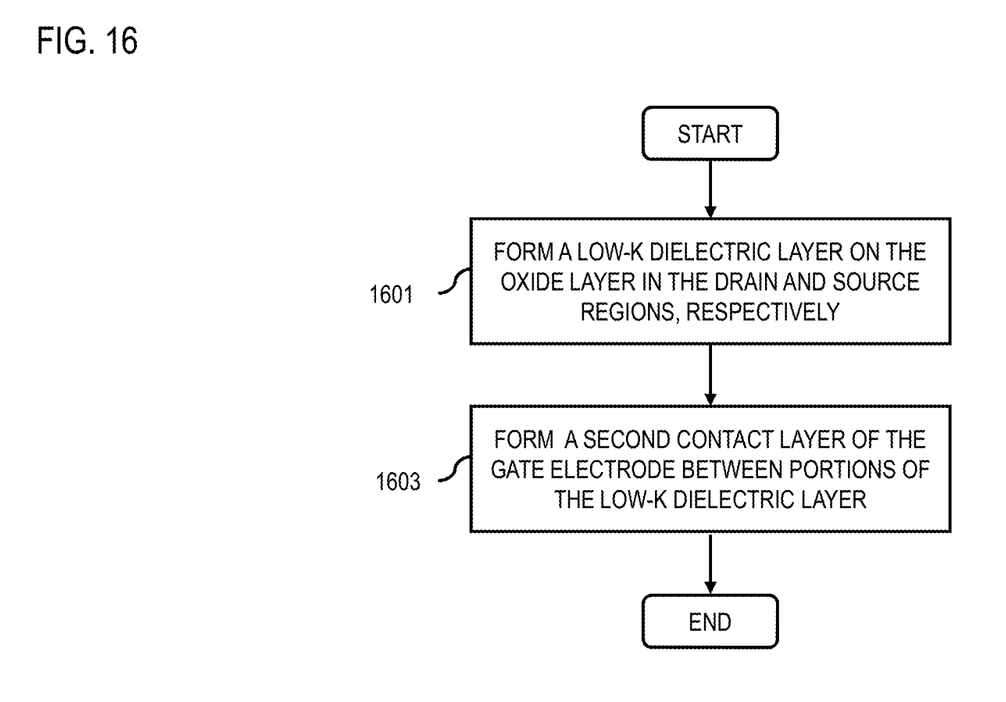
FIG. 16 is a flowchart of steps for continuing fabrication of semiconductor devices having a low gate horizontal resistance, in accordance with an exemplary embodiment.

FIG. 16 is a flowchart of a process for continuing fabrication of semiconductor devices having a low gate horizontal resistance, according to an exemplary embodiment. The process of FIG. 16 is discussed with respect to FIGS. 17 through 19, and being after the metal gate 1003 or 1503 is formed, according to methods illustrated in FIGS. 5 through 10 and FIGS. 11 through 15, respectively.

Figure 17:
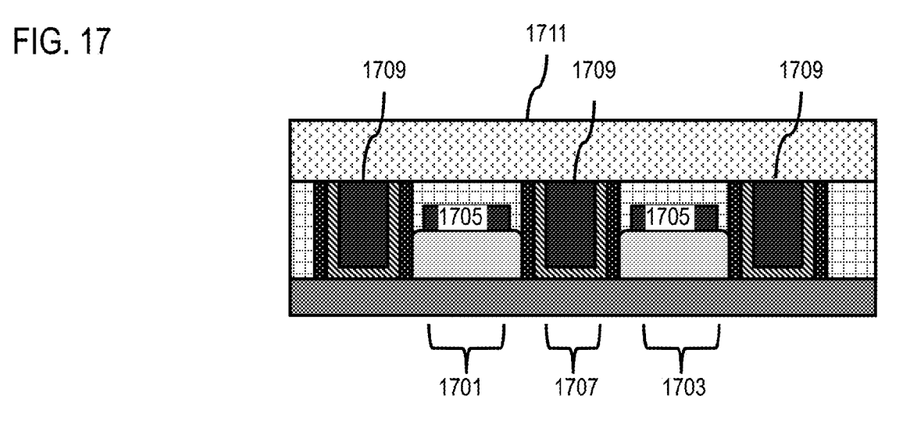
FIGS. 17 through 19 illustrate the steps for continuing fabrication of semiconductor devices having a low gate horizontal resistance, in accordance with exemplary embodiments.

Adverting to FIG. 17, source and drain regions 1701 and 1703, respectively, each having a contact layer 1705 separated by a gate region 1707 having a gate electrode 1709. A low-k dielectric layer 1711 is deposited over the top surface of source and drain regions 1701 and 1703, respectively, and gate electrode 1709. The process may optionally include a CMP after forming the low-k dielectric layer 1711.

Figure 18:
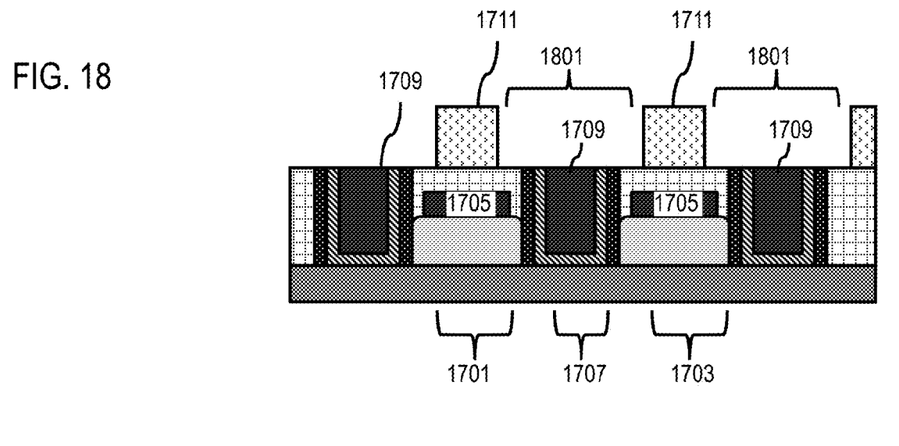
Figure 19:
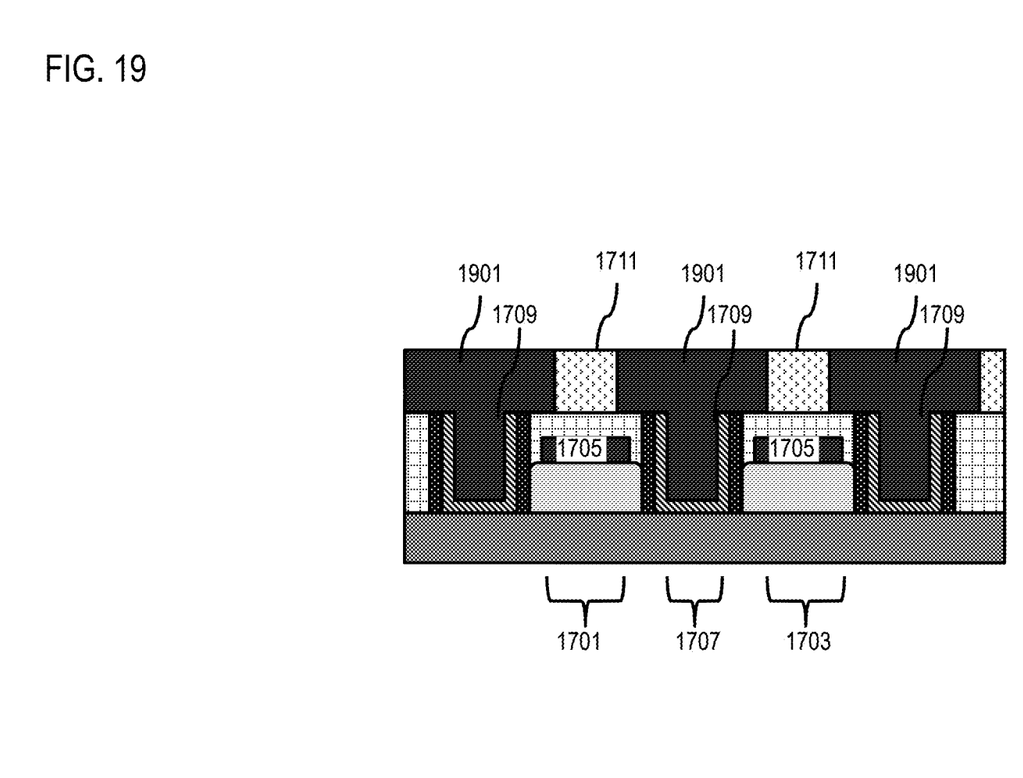

Adverting to FIG. 18, a litho-etch step is performed to remove portions of the low-k dielectric layer 1711 extending over the gate region 1707 and edges of regions 1701 and 1703, resulting in recesses 1801. During the litho etch step, gate electrode 1709 is reduced in height (not shown for illustrative convenience). Next, as illustrated in FIG. 19, gate contacts 1901 are deposited in the recesses 1801. The gate contacts 1901 extend over edges of the source and drain regions 1701 and 1703, respectively. CMP is performed after providing the gate contacts 1901.

Additionally, the steps illustrated in FIGS. 4 through 19 may further include a litho-etch step to open a low-k dielectric layer (e.g., 127) for forming vertical portions (e.g., contact landing portions) to land on buried contacts (e.g., W), such as, for instance, 113, 601, 1201, 1705.

The embodiments of the present disclosure achieve several technical effects, including fabrication of semiconductor devices, particularly FinFETs, having a low gate horizontal resistance without use of a tall gate structure, and a resulting device. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly at 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a substrate having a source region and a drain region separated along a first direction by a gate region, the first direction being perpendicular to a thickness direction of the substrate;
   forming a gate electrode on the gate region and having a first length along a second direction, the second direction being perpendicular to both the thickness direction of the substrate and the first direction;
   forming an epitaxy layer on the source region and the drain region;
   forming a first contact layer at least partially on the epitaxy layer and having a second length along the second direction, the second length being longer than the first length; and
   forming an oxide layer on a top surface and side surfaces of the first contact layer for at least the first length.

2. The method according to claim 1, comprising:
   forming the gate electrode by:
      forming a polycrystalline silicon gate on the gate region;
      forming a nitride layer on at least side surfaces of the polycrystalline silicon gate;
      removing the polycrystalline silicon gate to form a recess;
      forming a high-k dielectric in the recess;
      forming a metal gate on the high-k dielectric in the recess; and
      reducing a height of the metal gate; and
   forming a second contact layer on the metal gate for the first length.

3. The method according to claim 2, further comprising:
   forming the nitride layer on a top surface of the polycrystalline silicon gate; and
   removing the nitride layer from the top surface of the polycrystalline silicon gate prior to removing the polycrystalline silicon gate.

4. The method according to claim 1, comprising:
   forming the gate electrode by:
      forming a high-k dielectric layer in the gate region;
      forming a dummy gate on the high-k dielectric layer;
      annealing, prior to providing the oxide layer on the top surface of the first contact layer;
      removing the dummy gate to form a recess;
      forming a replacement metal gate on the high-k dielectric layer in the recess; and
      reducing a height of the metal gate; and
   providing a second contact layer on the replacement metal gate for the first length.

5. The method according to claim 4, wherein the high-k dielectric layer is at side surfaces and a bottom surface of the dummy gate, the method further comprising:
   forming a nitride layer on side surfaces of the high-k dielectric layer.

6. The method according to claim 5, further comprising:
   forming the first contact layer and the second contact layer of tungsten (W); and
   forming the dummy gate of titanium nitride (TiN) and polycrystalline silicon.

7. The method according to claim 1, comprising:
   forming a low-k dielectric layer on the oxide layer and having a first portion and a second portion in the drain region and the source region, respectively; and
   reducing a height of the gate electrode; and
   forming a second contact layer between the first portion and the second portion of the low-k dielectric layer and on the gate electrode, the second contact layer extending over the drain region and the source region over the first length
   and being separated from the first contact layer by the oxide layer.

8. The method according to claim 1, further comprising:
   forming a shallow trench isolation (STI) region in the substrate horizontally beyond the epitaxy layer, the first contact layer extending over the STI region;
   forming a vertical portion of the first contact layer over the STI region; and
   forming a second contact layer on the gate electrode.

9. A method comprising:
   providing a substrate having a source region and a drain region separated along a first direction by a gate region, the first direction being perpendicular to a thickness direction of the substrate;
   forming a gate electrode on the gate region and having a first length along a second direction and a first height, the second direction being perpendicular to both the thickness direction of the substrate and the first direction;
   forming an epitaxy layer on the source region and the drain region;
   forming a shallow trench isolation (STI) region in the substrate horizontally beyond the epitaxy layer;
   forming a tungsten (W) contact layer at least partially on the epitaxy layer and having a second length along the second direction, the second length being longer than the first length, the tungsten contact layer having a second height less than the first height, the tungsten contact layer extending horizontally over the STI region and comprising a vertical portion over the STI region, the tungsten contact layer being a first contact layer; and
   forming an oxide layer on a top surface and side surfaces of the first contact layer for at least the first length.

10. The method according to claim 9, comprising:
    forming the gate electrode by:
       forming a polycrystalline silicon gate on the gate region;
       forming a nitride layer on side surfaces and a top surface of the polycrystalline silicon gate;
       removing the nitride layer from the top surface of the polycrystalline silicon gate;
       removing, after removal of the nitride layer from the top surface of the polycrystalline silicon gate, the polycrystalline silicon gate to form a recess;
       forming a high-k dielectric in the recess;
       forming a titanium carbide (TiC) work function metal on the high-k dielectric in the recess;
       forming a metal gate on the work function metal in the recess, the metal gate having a height; and
       reducing the height of the metal gate to the first height; and
    forming a second contact layer on the metal gate for the first length.

11. The method according to claim 9, comprising:
forming the gate electrode by:
- forming a high-k dielectric layer in the gate region;
- forming a dummy gate on the high-k dielectric layer, the dummy gate comprising titanium nitride (TiN) and polycrystalline silicon;
- annealing, prior to providing the oxide layer on the top surface and the side surfaces of the first contact layer;
- removing the dummy gate to form a recess;
- forming a titanium carbide (TiC) work function metal layer in the recess;
- forming a replacement metal gate on the work function metal layer in the recess;
- reducing a height of the metal gate to the first height; and
- forming a second contact layer on the metal gate for the first length; and
- forming a nitride layer on side surfaces of the high-k dielectric layer.

12. The method according to claim 9, comprising:
forming a low-k dielectric layer on the oxide layer and having a first portion and a second portion in the drain region and the source region, respectively; and
forming a second contact layer on the gate electrode and between the first portion and the second portion of the low-k dielectric layer, the second contact layer extending over the drain region and the source region over the first length and being separated from the first contact layer by the oxide layer.

* * * * *